(12) United States Patent
Nagae et al.

(10) Patent No.: US 8,202,771 B2
(45) Date of Patent: Jun. 19, 2012

(54) MANUFACTURING METHOD OF ORGANIC SEMICONDUCTOR DEVICE

(75) Inventors: Mitsutaka Nagae, Tokyo-to (JP); Hironori Kobayashi, Tokyo-to (JP); Masanao Matsuoka, Tokyo-to (JP); Hiroyuki Honda, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 11/855,271

(22) Filed: Sep. 14, 2007

(65) Prior Publication Data

US 2008/0119010 A1 May 22, 2008

(30) Foreign Application Priority Data

Sep. 26, 2006 (JP) .................................. 2006-260653
Sep. 26, 2006 (JP) .................................. 2006-260660

(51) Int. Cl.
*H01L 21/00* (2006.01)
(52) U.S. Cl. .................... 438/161; 438/99; 257/E21.299
(58) Field of Classification Search .................. 438/159, 438/161; 257/E21.299, E21.37, E21.471, 257/E21.536
See application file for complete search history.

(56) References Cited

U.S. PATENT DOCUMENTS

| 5,879,853 | A | * | 3/1999 | Azuma | 430/166 |
| 2003/0207500 | A1 | * | 11/2003 | Pichler et al. | 438/127 |
| 2006/0094168 | A1 | * | 5/2006 | Hoffman et al. | 438/149 |
| 2006/0246620 | A1 | * | 11/2006 | Nagayama et al. | 438/99 |
| 2007/0087487 | A1 | * | 4/2007 | Honda | 438/149 |
| 2008/0053952 | A1 | * | 3/2008 | Okada et al. | 216/13 |

FOREIGN PATENT DOCUMENTS

JP 2006-058497 3/2006

* cited by examiner

*Primary Examiner* — Cheung Lee
(74) *Attorney, Agent, or Firm* — Ladas & Parry LLP

(57) ABSTRACT

A manufacturing method of an organic semiconductor device including an organic semiconductor transistor formation process, wherein the process includes: an organic semiconductor layer formation step of using a substrate to form an organic semiconductor layer made of an organic semiconductor material on the substrate; a passivation layer formation step of forming pattern-wise on the organic semiconductor layer a passivation layer having an ability of shielding vacuum ultraviolet light and an organic semiconductor layer patterning step of irradiating vacuum ultraviolet light to the passivation layer and to the organic semiconductor layer to etch the organic semiconductor layer corresponding to a part where the passivation layer is not formed.

1 Claim, 8 Drawing Sheets

MANUFACTURING METHOD OF ORGANIC SEMICONDUCTOR DEVICE

BACKGROUND OF THE INVENTION

1. Field of the Invention

The present invention relates to a manufacturing method of an organic semiconductor device using an organic semiconductor transistor.

2. Description of the Related Art

A semiconductor transistor typified by TFT shows the current trend towards spreading of its applications along with the development of display devices. Such a semiconductor transistor functions as a switching element when the electrodes are connected through a semiconductor material.

As the semiconductor material used for the semiconductor transistor, inorganic semiconductor materials such as silicon (Si), gallium arsenic (GaAs) and indium gallium arsenic (InGaAs) are used. Semiconductor transistors using such an inorganic semiconductor are also used for display TFT array substrates of liquid crystal display devices which have been widely spread in recent years.

On the other hand, organic semiconductor materials made of organic compounds are known as the semiconductor material. Organic semiconductor materials have an advantage in that: they are allowed to be increased in area at a lower cost than those using the inorganic semiconductor materials, and they can be formed on a flexible plastic substrate and are also stable against mechanical impact. Therefore, active studies are being made as to technologies assumed to be applied display devices such as flexible displays typified by electronic paper in the next generation.

In the meantime, along with a rapid spread of and an increase in the size of thin type display devices which have been recently developed, it is demanded of organic semiconductor devices using an organic semiconductor material to be mass-producible with high productivity in an industrial production process. However, no method has been established yet which is capable of producing an organic semiconductor transistor using an organic semiconductor material at high productivity in contrast to conventional transistors using an inorganic semiconductor material. This is caused by the characteristics common to many organic semiconductor materials.

Specifically, the organic semiconductor materials have the characteristics that they develop excellent semiconductor characteristics when they are made into films under heating. Therefore, when semiconductor transistors are produced using these semiconductor materials, it is necessary to use a method in which it is patterned after a layer made of the organic semiconductor material is formed.

As the method of patterning the layer formed of the organic semiconductor material, a photoresist method using a photoresist is usually used (for example, see Japanese Patent Application Laid-Open No. 2006-58497). Such a photoresist method is superior in the point that a layer made of an organic semiconductor material can be patterned into a desired pattern with high accuracy. However, this method has the problem that it is inferior in productivity because of complicated steps involved.

This gives rise to the problem that organic semiconductor devices using the organic semiconductors cannot be produced industrially with high efficiency though they are known to have high usability.

SUMMARY OF THE INVENTION

The present invention has been made in view of the aforementioned problem, and it is a main object of the present invention to provide a manufacturing method of an organic semiconductor device, the method enabling an organic semiconductor layer to be patterned simply with high productivity and also enabling an organic semiconductor device having an organic semiconductor transistor to be produced with high productivity.

To solve the above-mentioned problem, the present invention provides a manufacturing method of an organic semiconductor device comprising an organic semiconductor transistor formation process, wherein the process includes: an organic semiconductor layer formation step of using a substrate to form an organic semiconductor layer made of an organic semiconductor material on the substrate: a passivation layer formation step of forming pattern-wise on the organic semiconductor layer a passivation layer having an ability of shielding vacuum ultraviolet light; and an organic semiconductor layer patterning step of irradiating vacuum ultraviolet light to the passivation layer and to the organic semiconductor layer to etch the organic semiconductor layer corresponding to a part where the passivation layer is not formed.

According to the present invention, the passivation layer formed in the passivation layer formation step has the ability of shielding vacuum ultraviolet light, and the organic semiconductor layer patterning step is a step of carrying out patterning of the organic semiconductor layer by irradiating vacuum ultraviolet light to the organic semiconductor layer and the passivation layer. Therefore, in the organic semiconductor layer patterning step, the passivation layer functions as a mask shielding vacuum ultraviolet light to remove the organic semiconductor layer corresponding only to the part where the passivation layer is not formed, thereby making it possible to carry out patterning. The present invention therefore makes it possible to simply pattern the organic semiconductor layer with high accuracy only by merely irradiating vacuum ultraviolet light in the organic semiconductor layer patterning step.

From this fact, the present invention enables the organic semiconductor layer to be simply patterned with high accuracy and therefore, an organic semiconductor device having an organic semiconductor transistor can be produced with high productivity.

In the present invention, the wavelength of the vacuum ultraviolet light is preferably in a range from 10 nm to 200 nm. This is because if vacuum ultraviolet light having a wavelength falling in the range is irradiated, the patterning of the organic semiconductor layer can be carried out in a short time in the organic semiconductor layer patterning step.

Also, in the present invention, the passivation layer is preferably formed of a light-shielding resin material having the ability of shielding the vacuum ultraviolet light. This is because a passivation layer superior in the ability to shield the vacuum ultraviolet light can be easily formed in the passivation layer formation step.

To solve the above-mentioned problem, the present invention further provides a manufacturing method of an organic semiconductor device comprising an organic semiconductor transistor formation process, wherein the process includes: an organic semiconductor layer formation step of using a substrate to form an organic semiconductor layer made of an organic semiconductor material on the substrate; a gate insulation layer formation step of forming pattern-wise on the organic semiconductor layer a gate insulation layer having an ability of shielding vacuum ultraviolet light; and an organic semiconductor layer patterning step of irradiating vacuum ultraviolet light to the gate insulation layer and to the organic semiconductor layer to etch the organic semiconductor layer corresponding to a part where the gate insulation layer is not formed.

According to the present invention, since the gate insulation layer formed in the gate insulation layer formation step has the ability of shielding vacuum ultraviolet light, and since the organic semiconductor layer patterning step is a process of patterning the organic semiconductor layer by irradiating vacuum ultraviolet light to the organic semiconductor layer and to the gate insulation layer, the result is brought in the organic semiconductor layer patterning step that the gate insulation layer functions as a mask shielding vacuum ultraviolet light, and it is therefore possible to remove only the organic semiconductor layer corresponding to the part where the gate insulation layer is not formed. Consequently, according to the present invention, the patterning of the organic semiconductor layer can be simply attained with high accuracy only by merely irradiating vacuum ultraviolet light in the organic semiconductor layer patterning step.

From this fact, according to the present invention, the patterning of the organic semiconductor layer can be simply attained with high accuracy, and therefore an organic semiconductor device having an organic semiconductor transistor can be manufactured with high productivity.

In the present invention, the wavelength of the vacuum ultraviolet light is preferably in a range from 10 nm to 200 nm. This is because if vacuum ultraviolet light having a wavelength falling in the range is irradiated, the patterning of the organic semiconductor layer can be carried out in a short time in the organic semiconductor layer patterning step.

In addition, in the present invention, the gate insulation layer is preferably formed of a light-shielding resin material having the ability of shielding the vacuum ultraviolet light. This is because a gate insulation layer superior in the ability to shield the vacuum ultraviolet light can be easily formed in the gate insulation layer formation step.

The manufacturing method of an organic semiconductor device according to the present invention produces such an effect that the patterning of the organic semiconductor layer can be simply attained with high accuracy and an organic semiconductor device provided with an organic semiconductor transistor can be produced with high productivity.

DESCRIPTION OF THE PREFERRED EMBODIMENT

A manufacturing method of an organic semiconductor device according to the present invention will be described in detail.

The manufacturing method of an organic semiconductor device according to the present invention may be roughly classified into two embodiments. Hereinafter, the manufacturing method of an organic semiconductor device of the present invention will be described in each embodiment separately.

A. Manufacturing Method of an Organic Semiconductor Device in a First Embodiment The first embodiment of the manufacturing method of an organic semiconductor device will be explained first. The manufacturing method of an organic semiconductor device of the present embodiment comprises an organic semiconductor transistor formation process, wherein the process includes: an organic semiconductor layer formation step of using a substrate to form an organic semiconductor layer made of an organic semiconductor material on the substrate; a passivation layer formation step of forming pattern-wise on the organic semiconductor layer a passivation layer having an ability of shielding vacuum ultraviolet light; and an organic semiconductor layer patterning step of irradiating vacuum ultraviolet light to the passivation layer and to the organic semiconductor layer to etch the organic semiconductor layer corresponding to a part where the passivation layer is not formed.

Figure 1A:
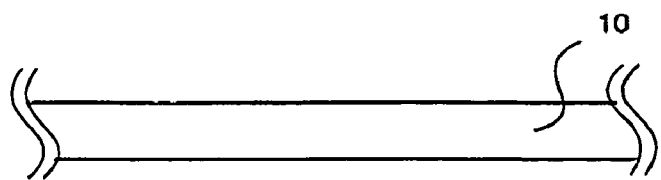
FIGS. 1A to 1E are a schematic view showing an example of a manufacturing method of an organic semiconductor device according to a first embodiment of the present invention.
Figure 1B:
Figure 1C:
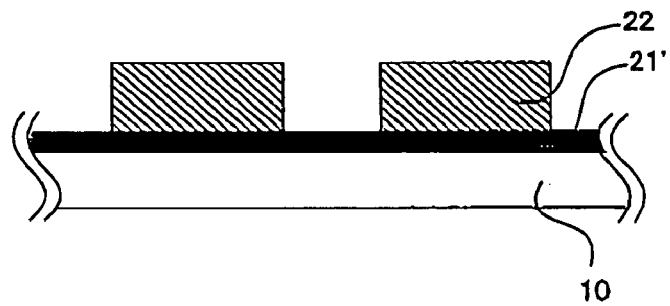
Figure 1D:
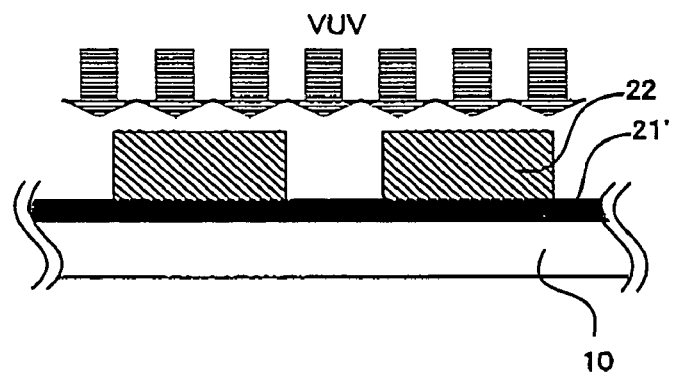
Figure 1E:
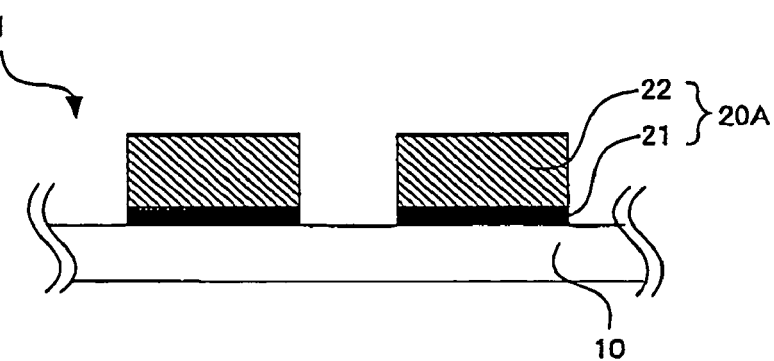

The manufacturing method of an organic semiconductor device according to this embodiment will be described with reference to the drawings. FIGS. 1A to 1E are a schematic view showing an example of the manufacturing method of an organic semiconductor device of this embodiment. As illustrated in FIGS. 1A to 1E, the manufacturing method of an organic semiconductor device of this embodiment comprises an organic semiconductor transistor formation process, wherein the process includes: an organic semiconductor layer formation step of using a substrate 10 (FIG. 1A) to form an organic semiconductor layer 21' made of an organic semiconductor material on the substrate 10 (FIG. 1B); a passivation layer formation step of forming a passivation layer 22 having the ability of shielding vacuum ultraviolet light pattern-wise on the organic semiconductor layer 21' (FIG. 1C); and an organic semiconductor layer patterning step of irradiating vacuum ultraviolet light to the passivation layer 22 and to the organic semiconductor layer 21' to etch the organic semiconductor layer 21' corresponding to the part where the passivation layer 22 is not formed (FIG. 1D). Thereby, the manufacturing method produces an organic semiconductor device 1 formed with an organic semiconductor transistor 20A having a structure on the substrate 10 in which the passivation layer 22 is laminated on the organic semiconductor layer 21 (FIG. 1E).

According to this embodiment, since the passivation layer to be formed in the passivation layer formation step has the ability of shielding vacuum ultraviolet light, and since the organic semiconductor layer patterning step is a process of carrying out patterning of the organic semiconductor layer by irradiating vacuum ultraviolet light to the organic semiconductor layer and to the passivation layer, the result is brought in the organic semiconductor layer patterning step that the passivation layer functions as a mask shielding vacuum ultraviolet light, and only the organic semiconductor layer corresponding to the part where the passivation layer is not formed can be removed, and thereby making it possible to carry out patterning. Consequently, according to this embodiment, the patterning of the organic semiconductor layer can be simply attained with high accuracy only by merely irradiating vacuum ultraviolet light in the organic semiconductor layer patterning step.

From this fact, according to this embodiment, the patterning of the organic semiconductor layer can be simply attained with high accuracy, and therefore an organic semiconductor device having an organic semiconductor transistor with high productivity can be manufactured.

When an organic semiconductor transistor using an organic semiconductor material is manufactured, a photographic method has been usually used as a method of carrying out patterning of a layer made of an organic semiconductor material. However, this photolithographic method has the problem that its process is complicated and is therefore inferior in productivity.

According to this embodiment, on the other hand, the passivation layer formed in the passivation layer formation step is made to have the ability of shielding vacuum ultraviolet light and it is therefore possible to carry out patterning of the organic semiconductor layer only by simply irradiating vacuum ultraviolet light from a light source without using a photomask and a photoresist. Therefore, according to this embodiment, an organic semiconductor device can be produced with high productivity.

The manufacturing method of an organic semiconductor according to this embodiment comprises an organic semiconductor transistor formation process involving at least the organic semiconductor layer formation step, the passivation layer formation step and the organic semiconductor layer patterning step, and may involve other steps according to the need.

Each step used in the manufacturing method of an organic semiconductor device according to this embodiment will be described in detail.

1. Organic Semiconductor Transistor Formation Process

First, the organic semiconductor transistor formation process used in this embodiment will be described. This step includes: an organic semiconductor layer formation step of using a substrate to form an organic semiconductor layer made of an organic semiconductor material on the substrate, a passivation layer formation step of forming pattern-wise on the organic semiconductor layer a passivation layer having the ability of shielding vacuum ultraviolet light, and an organic semiconductor layer patterning step of irradiating vacuum ultraviolet light to the passivation layer and the organic semiconductor layer to y etch the organic semiconductor layer corresponding to the part where the passivation layer is not formed. The manufacturing method of an organic semiconductor device in this embodiment enables the formation of an organic semiconductor device with high productivity since it is provided with such an organic semiconductor transistor formation process.

The organic semiconductor layer formation step, the passivation layer formation step, the organic semiconductor layer patterning step and other steps to be used in this process will be described below.

(1) Passivation Layer Formation Step

First, the passivation layer formation step used in this process will be described. This step is a process of forming a passivation layer having the ability of shielding vacuum ultraviolet light used in the organic semiconductor layer patterning step which will be described later, pattern-wise on the organic semiconductor layer formed in the organic semiconductor layer formation step which will be described later. The passivation layer formed in this process has a function as a mask used to etch by using vacuum ultraviolet light the organic semiconductor layer pattern-wise when carrying out the patterning of the organic semiconductor layer in the organic semiconductor layer patterning step which will be described late, and also has a function as a protective material that prevents the organic semiconductor transistor from deteriorating in transistor characteristics with time in the organic semiconductor device manufactured according to this embodiment.

a. Method of Forming a Passivation Layer

In this process, any method may be used without any particular limitation as the method of forming the passivation layer insofar as it is a method which is capable of forming a passivation layer having the ability desired to shield vacuum ultraviolet light used in the organic semiconductor layer patterning step which will be described later and having the function of protecting an organic semiconductor transistor. Among these methods, a method in which a passivation layer formation coating solution prepared by dissolving the passivation layer formation material having the aforementioned light-shielding and protecting functions is applied pattern-wise to the organic semiconductor layer is preferably used in this process. This is because the use of this method makes possible to form the passivation layer in a simple process.

Any material may be used as the passivation layer formation material without any particular limitation insofar as it can form the passivation layer having the shielding and protecting functions. Examples of such a passivation layer formation material may include light-shielding resin materials having the ability of shielding the vacuum ultraviolet light and the protective function, and mixtures of resin materials having the protective function and light-shielding agents having the light-shielding function. In this process, the light-shielding resin materials among these passivation layer formation materials are preferably used though any of these passivation layer formation materials may be used. The reason is that the light-shielding resin materials are advantageous in the production cost because they are individually capable of forming the passivation layer having the light-shielding function and protecting function. Also, this is because the use of the light-shielding resin material makes it easy to form a passivation layer superior in the ability of shielding vacuum ultraviolet light.

Any light-shielding resin material may be used as the light-shielding resin material used in this process without any particular limitation insofar as it is soluble in a desired concentration in a solvent used in the passivation layer formation coating solution. Examples of such a light-shielding material may include PVP, PVA, PMMA, PS, polyethyleneoxide (PEO), aqueous epoxy resins, epoxy resins, acryl resins, polyimide and cardo-type resins.

In this process, the light-shielding resin materials may be used either singly or in combinations of two or more.

Any solvent may be used as the solvent used in the passivation layer formation coating solution without any particular limitation insofar as the passivation layer formation material can be dissolved in a desired concentration and the organic semiconductor material constituting the organic semiconductor layer is scarcely dissolved in this solvent. An appropriate solvent may be selected and used in accordance with, for example, the type of passivation layer formation material and the type of organic semiconductor material constituting the organic semiconductor layer. Examples of such a solvent include ethanol, propanol, butanol, pentanol, hexanol, isopropyl alcohol, PGMEA and water.

In this process, these solvents may be used either singly or in combinations of two or more.

No particular limitation is imposed on the solid content of the passivation layer formation coating solution insofar as it is in a range where, for example, the solution viscosity and surface tension of the passivation layer formation coating solution fall in each desired range in accordance with the coating method used to apply the passivation layer formation coating solution to the surface of the organic semiconductor layer. The solid concentration is preferably in a range from 5% by weight to 30% by weight.

As the method for forming the passivation layer by applying the passivation layer formation coating solution to the organic semiconductor layer, any method that can form the passivation layer into a desired pattern may be used without any particular limitation. Examples of such a method may include: a method in which using a printing method, the passivation layer formation coating solution is applied pattern-wise to the surface of the organic semiconductor layer (first method), and a method in which after a non-patterned passivation layer is formed by applying the passivation layer formation coating solution to the entire surface of the organic semiconductor layer, the passivation layer is patterned by a lithographic method (second method).

In this process, the first method is preferably used though any of these first and second methods may be used. The reason is that the second method needs two steps including a step of forming a non-patterned passivation layer and a step of patterning the passivation layer to form a patterned passivation layer, whereas the first method enables direct formation of a patterned passivation layer by one step, making it possible to simplify this step.

Any printing method may be used as the printing method in the first method without any particular limitation as long as the passivation layer formation coating solution can be made into a desired pattern by printing. Examples of such a printing method may include an ink jet method, screen printing method, pad printing method, flexo-printing method, microcontact printing method, gravure printing method, offset printing method and gravure offset printing method. Among these methods, a screen printing method is preferably used in this process. This is because the use of a screen printing method makes it possible to form highly accurate pattern-wise passivation layer.

b. Passivation Layer

The passivation layer formed in this process has the ability to protect the organic semiconductor transistor described above and the ability to shield vacuum ultraviolet light used in the organic semiconductor patterning step which will be described later. Here, there is no particular limitation to the level of the light-shielding ability as long as it is a level at which the organic semiconductor layer corresponding to the part where the passivation layer is formed in this process is not deteriorated in the organic semiconductor layer patterning step which will be described later. Therefore, the shielding level may be properly determined according to the wavelength of the vacuum ultraviolet light used in the organic semiconductor layer patterning step which will be described later. Particularly, the transmittance of the passivation layer formed in this process for the vacuum ultraviolet light used in the organic semiconductor layer patterning step which will be described later is preferably 10% or less, more preferably 3% or less and still more preferably 1% or less. This is because when the transmittance for the vacuum ultraviolet light is in the range, the organic semiconductor layer is prevented from deteriorating in the organic semiconductor layer patterning step which will be described later irrespective of the wavelength of the vacuum ultraviolet light used in the organic semiconductor layer patterning step.

There is no particular limitation to the thickness of the passivation layer formed in this process insofar as it is in a range where the desired ability of shielding the vacuum ultraviolet light used in the organic semiconductor layer formation patterning step is obtained and the desired ability of protecting the organic semiconductor transistor is obtained. Particularly, the thickness of the passivation layer is preferably 100 $\mu m$ or less, more preferably in a range from 0.1 $\mu m$ to 10 $\mu m$, and still more preferably in a range from 0.3 $\mu m$ to 1 $\mu m$.

(2) Organic Semiconductor Layer Patterning Step

Next, the organic semiconductor layer patterning step used in this process will be described. In this process, the organic semiconductor layer formed by the organic semiconductor layer formation step which will be described later and the passivation layer formed in the passivation layer formation step are irradiated with vacuum ultraviolet light to etch the organic semiconductor layer corresponding to the part where the passivation layer is not formed.

In this process, the passivation layer functions as a mask for vacuum ultraviolet light used in this process and therefore, the organic semiconductor layer can be easily patterned only by irradiating vacuum ultraviolet light.

In this process, since the passivation layer is used as a mask to carry out patterning, the pattern of the organic semiconductor layer to be patterned in this process is the same as the pattern of the passivation layer which has been formed.

In this process, as mentioned above, the method is used in which the organic semiconductor layer corresponding to the part where the passivation layer is not formed is removed by irradiating the surface of the passivation layer and the surface of the organic semiconductor layer with the vacuum ultraviolet light. Here, the vacuum ultraviolet light in this embodiment means ultraviolet rays having a wavelength range from 10 nm to 200 nm. No particular limitation is imposed on the vacuum ultraviolet light insofar as it has a wavelength that can remove the organic semiconductor layer in a desired time and vacuum ultraviolet light is preferably used which has an adequate wavelength in accordance with the type of organic semiconductor material constituting the organic semiconductor layer. Particularly, the wavelength of the vacuum ultraviolet light used in this process is preferably in a range from 10 nm to 200 nm, more preferably in a range from 126 nm to 193 nm, still more preferably 172 nm. This is because if vacuum ultraviolet light having a wavelength falling in the range is used, the organic semiconductor layer can be patterned in a short time in the organic semiconductor layer patterning step irrespective of the type of organic semiconductor material constituting the organic semiconductor layer.

In this process, examples of the light source used to irradiate the vacuum ultraviolet light may include an excimer lamp, low-voltage mercury lamp and other various light sources.

Also, no particular limitation is imposed on the dose of the vacuum ultraviolet light in this process as long as it is within a range where the organic semiconductor layer can be removed and the dose may be properly adjusted according to factors such as the type of organic semiconductor material constituting the organic semiconductor layer and the wavelength of the vacuum ultraviolet light.

There is no particular limitation to the method for irradiating vacuum ultraviolet light to the passivation layer and to the organic semiconductor layer in this process, insofar as it is capable of irradiating vacuum ultraviolet light to the passivation layer and to the organic semiconductor layer at a uniform dose. Examples of the irradiation method may include: a method in which the entire surfaces of the passivation layer and the organic semiconductor layer are irradiated simultaneously, and a method in which at least one of the light source and the substrate on which the passivation layer and the organic semiconductor layer are formed is moved to irradiate the whole surfaces of these layers one after another. It is preferable to use the latter method among these methods in this process. The reason is as follows.

Because the vacuum ultraviolet light is non-directional dispersed light, the method in which the entire surfaces of the passivation layer and the organic semiconductor layer are irradiated simultaneously has the possibility that it gives rise to a difference in the dose of the vacuum ultraviolet light between the center part and the end part in the case of irradiating the passivation layer and the organic semiconductor layer having a large area with the vacuum ultraviolet light. However, according to the method in which the whole surface of these layers are irradiated with ultraviolet light one after another, the vacuum ultraviolet light can be easily irradiated uniformly to the entire surface even if the passivation layer and the organic semiconductor layer having a large area are irradiated with the vacuum ultraviolet light.

In addition, in this process, among the methods in which these layers are irradiated one by one, a method is preferably used in which the substrate on which the passivation layer and the organic semiconductor layer are formed is fixed and irradiated with the vacuum ultraviolet light, while the light source is moved. This is because this method makes it easy to irradiate the passivation layer and the organic semiconductor layer having a large area uniformly.

The number of light sources of the vacuum ultraviolet light used in this process may be one though plural light sources may be used. In the case of using the method in which the vacuum ultraviolet light is irradiated with moving the light source as the method of irradiating the vacuum ultraviolet light in this process when plural light sources are used, these plural light sources may be moved either simultaneously or individually.

(3) Organic Semiconductor Layer Formation Step

Next, the organic semiconductor layer formation step used in this process will be described. This step is a process in which a substrate is used to form an organic semiconductor layer made of an organic semiconductor material on the substrate.

a. Method of Forming an Organic Semiconductor Layer

No particular limitation is imposed on the method of forming an organic semiconductor layer on the substrate in this process insofar as it is a method capable of forming an organic semiconductor layer having a desired thickness on the substrate in accordance with factors such as the type of organic semiconductor material. Examples of such a method may include a method in which, for example, in the case where the organic semiconductor material is soluble in a solvent, the organic semiconductor material is dissolved in a solvent to prepare an organic semiconductor layer formation coating solution and then, the coating solution is applied to the substrate. Examples of the coating method in this case may include a spin coating method, die coating method, roll coating method, bar coating method, LB method, dip coating method, spray coating method, blade coating method and casting method.

In the case where the organic semiconductor material is insoluble in a solvent, a method of forming an organic semiconductor layer on the substrate by a dry process such as vacuum vapor deposition may be given as examples.

No particular limitation is imposed on the organic semiconductor material used in this step insofar as it is a material capable of forming an organic semiconductor layer having desired semiconductor characteristics according to factors such as the use of the organic semiconductor device manufactured in the present embodiment. Examples of the organic semiconductor material may include π-electron conjugate type aromatic compounds, chain type compounds, organic pigments and organic silicon compounds. Specific examples of the organic semiconductor material may include: low-molecular organic semiconductor materials such as pentacene, and high-molecular type organic semiconductor materials, for example, polypyrroles such as polypyrrol, poly(N-substituted pyrrole), poly(3-substituted pyrrole) and poly(3,4-disubstituted pyrrole), polythiophenes such as polythiophene, poly(3-substituted thiophene), poly(3,4-disubstituted thiophene) and polybenzothiophene, polyisothianaphthenes such as polyisothianaphthene, polythenylenevinylenes such as polythenylenevinylene, poly(p-phenylenevinylenes) such as poly(p-phenylenevinylene), polyanilines such as polyaniline and poly(N-substituted aniline), polyacetylenes such as polyacetylene and polydiacetylene, and polyazulenes such as polyazulene. Among them, pentacene or one of polythiophenes is preferably used in the present step.

b. Substrate

As the substrate used in the present step, those having a desired function according to factors such as the use of the organic semiconductor device manufactured in the present embodiment may be used. As such a substrate, a rigid substrate having no flexibility such as a glass substrate may be used, or a flexible substrate such as a plastic resin film may be used. Although either of these rigid substrate or flexible substrate is used in the present step, a flexible substrate is preferably used. This is because if such a flexible substrate is used, the organic semiconductor device of the present embodiment can be produced by a Roll-to-Roll process and the organic semiconductor device of the present embodiment may be manufactured with higher productivity.

Examples of the plastic resin used in the present step may include PET, PEN, PES, PI, PEEK, PC, PPS and PEI.

Also, the thickness of the substrate used in the present step is usually 1 mm or less, and more preferably in a range from 50 μm to 700 μm.

c. Organic Semiconductor Layer

No particular limitation is imposed on the thickness of the organic semiconductor layer formed in this process as long as it is in a range where an organic semiconductor layer having desired semiconductor characteristics can be formed in accordance with factors such as the type of the organic semiconductor material. The thickness of the organic semiconductor layer is preferably 1000 nm or less, more preferably in a range from 5 nm to 300 nm, and still more preferably in a range from 20 nm to 100 nm in this process.

(4) Other Steps

This process may involve other steps in addition to the passivation layer formation step, the organic semiconductor layer formation step and the organic semiconductor layer patterning step. As these other steps, any desired step may be used in accordance with factors such as the structure of the organic semiconductor transistor to be formed in this process without any particular limitation. Among these steps, a gate electrode formation step of forming a gate electrode, a gate insulation layer formation step of forming a gate insulation layer, and a source/drain electrode formation step of forming source and drain electrodes are used in this process.

Figure 2A:
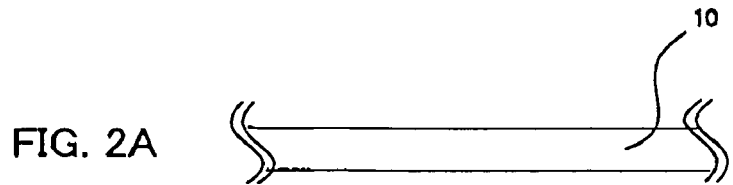
FIGS. 2A to 2G are a schematic view showing another example of a manufacturing method of an organic semiconductor device according to a first embodiment of the present invention.
Figure 2B:
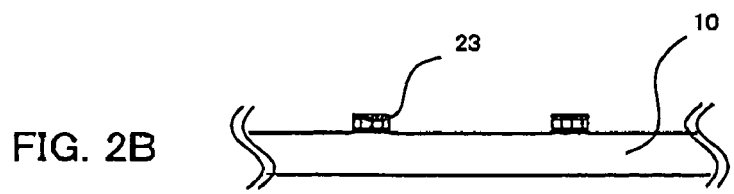
Figure 2C:
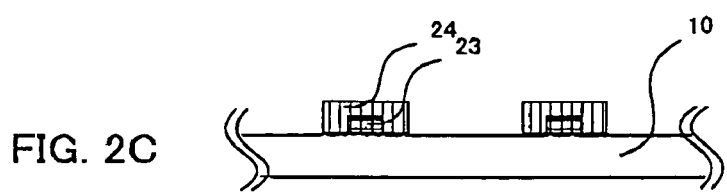
Figure 2D:
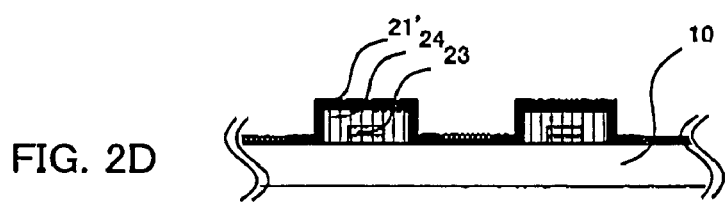
Figure 2E:
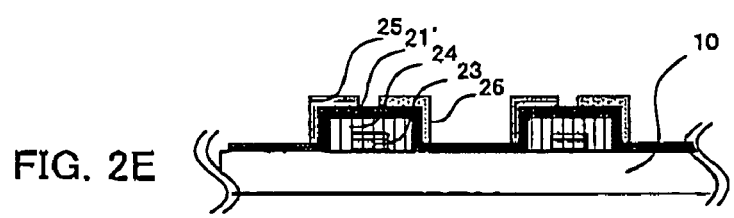
Figure 2F:
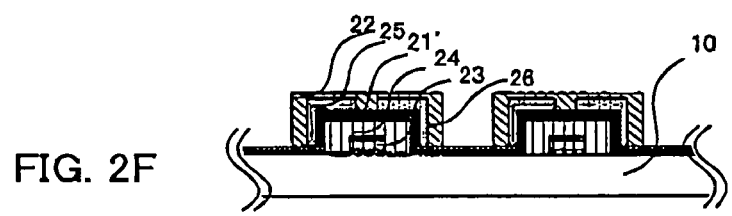
Figure 2G:
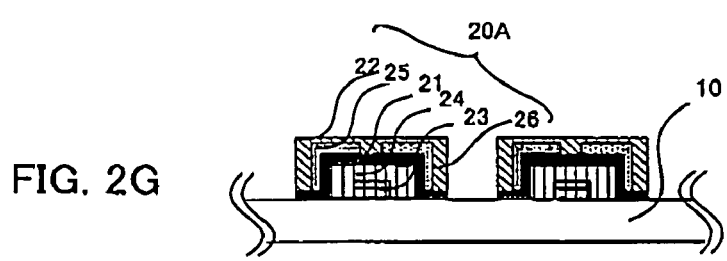

Detailed descriptions are provided as to the case where this process involves the gate electrode formation step, the gate insulation layer formation step and the source/drain electrode formation step with reference to the drawings. FIGS. 2A to 2G are a schematic view showing an example of the case where this process involves the gate electrode formation step, gate insulation layer formation step and source/drain electrode formation step. As shown in FIGS. 2A to 2G, this process is used in an embodiment involving the following steps to form an organic semiconductor transistor 20A: a gate electrode formation step of using a substrate 10 (FIG. 2A) in general to form a gate electrode 23 on the substrate 10 (FIG. 2B); a gate insulation layer formation step of forming a gate insulation layer 24 so as to cover the gate electrode 23 (FIG. 2C); an organic semiconductor layer formation step of forming an organic semiconductor layer 21' on the gate insulation layer 24 and the substrate 10 by using the aforementioned method (FIG. 2D); a source/drain electrode formation step of forming a source electrode 25 and a drain electrode 26 so as to face each other on the organic semiconductor layer 21' (FIG. 2E); a passivation layer formation step of forming a pattern-like passivation layer 22 on the organic semiconductor layer 21', source electrode 25 and drain electrode 26 by the aforementioned method (FIG. 2F); and an organic semiconductor layer patterning step of etching the organic semiconductor layer 21' corresponding to the part where the passivation layer 22 is not formed (FIG. 2G).

In FIGS. 2A to 2G, detailed descriptions are provided as to an example in which an organic semiconductor transistor having a bottom gate/top contact structure by this process. However, in this process, the embodiment using the gate electrode formation step, the gate insulation layer formation step and the source/drain electrode formation step is not limited to the aforementioned case. Therefore, in this process, the embodiment using the gate electrode formation step, gate insulation layer formation step and source/drain electrode formation step may be: an embodiment used to form an organic semiconductor transistor having a bottom gate/bottom contact structure, an embodiment used to form an organic semiconductor transistor having a top gate/top contact structure, or an embodiment used to form an organic semiconductor transistor having a top gate/bottom contact structure.

In the embodiment in which the gate electrode formation step, the gate insulation layer formation step and the source/drain electrode formation step are used to form an organic semiconductor transistor having a bottom gate/bottom contact structure, this process is carried out in the order of a gate electrode formation step, a gate insulation layer formation step, a source/drain electrode formation step, an organic semiconductor layer formation step, a passivation layer formation step and an organic semiconductor layer patterning step.

In the embodiment in which the gate electrode formation step, the gate insulation layer formation step and the source/drain electrode formation step are used to form an organic semiconductor transistor having a top gate/top contact structure, this process is carried out in the order of an organic semiconductor layer formation step, a source/drain electrode formation step, a gate insulation layer formation step, a gate electrode formation step, a passivation layer formation step and an organic semiconductor layer patterning step.

In the embodiment in which the gate electrode formation step, the gate insulation layer formation step and the source/drain electrode formation step are used to form an organic semiconductor transistor having a top gate/bottom contact structure, this process is carried out in the order of a source/drain electrode formation step, an organic semiconductor layer formation step, a gate insulation layer formation step, a gate electrode formation step, a passivation layer formation step and an organic semiconductor layer patterning step.

In the gate electrode formation step, the gate insulation layer formation step and the source/drain electrode formation step used in this process, the methods of forming the gate electrode, the gate insulation layer and the source and drain electrodes respectively are the same as those used in the formation of a usual semiconductor transistor and therefore, detailed descriptions are omitted here.

(5) Organic Semiconductor Transistor

The organic semiconductor transistor formed in this process is provided with at least the organic semiconductor layer and the passivation layer. Usually, besides the organic semiconductor layer and the passivation layer, a gate electrode, a source electrode, a drain electrode and a gate insulation layer are used in the organic semiconductor transistor, whereby the function as a transistor is developed.

Here, no particular limitation is imposed on the structure of the organic semiconductor transistor formed in this process as long as it has a structure using the organic semiconductor layer and the passivation layer, and a generally known thin film transistor structure may be adopted. Examples of such an organic semiconductor transistor may include a bottom gate type structure and a top gate type structure.

Figure 3A:
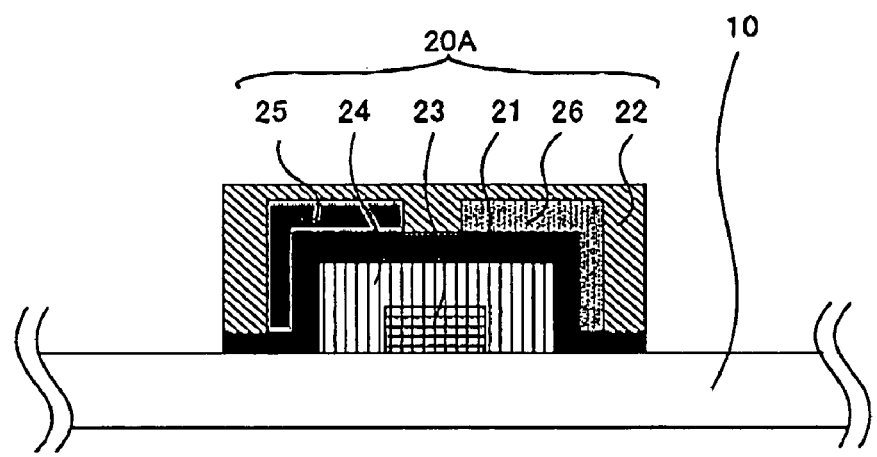
FIGS. 3A to 3B are each a schematic view showing an example of an organic semiconductor transistor included in an organic semiconductor device manufactured in a first embodiment according to the present invention.
Figure 3B:
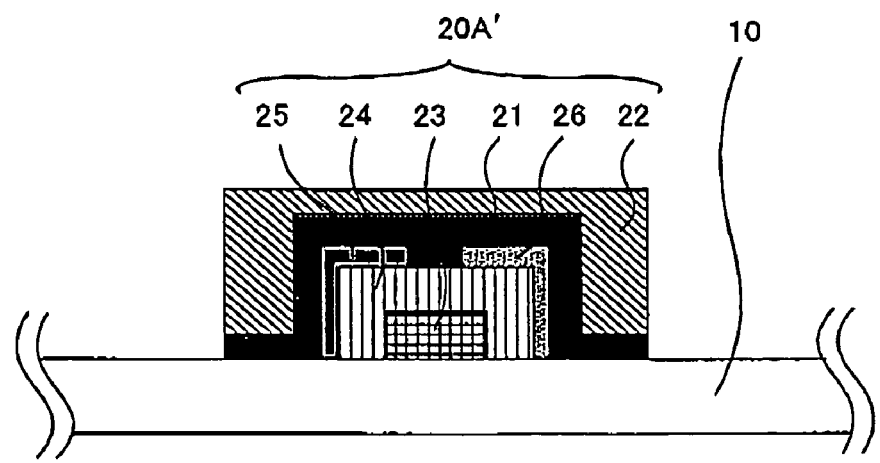

An organic semiconductor transistor formed in this process in the case where it has a bottom gate type structure will be described with reference to the drawings. FIGS. 3A and 3B are each a schematic view showing an example of an embodiment of an organic semiconductor transistor formed in this process when it has a bottom gate structure. As illustrate in FIGS. 3A and 3B, organic semiconductor transistors 20A and 20A' formed in this process may each have a bottom gate type structure provided with a substrate 10, a gate electrode 23 formed on the substrate 10, a gate insulation layer 24 formed so as to cover the gate electrode 23, an organic semiconductor layer 21 formed on the gate insulation layer 24 and on the substrate 10, a source electrode 25 and a drain electrode 26 formed so as to be in contact with the organic semiconductor layer 21, and a passivation layer 22 formed so as to cover the organic semiconductor layer 21.

Also, such a bottom gate type structure may be: a bottom gate/top contact structure in which the source electrode 25 and the drain electrode 26 are disposed on the upper side of the organic semiconductor layer 21 (FIG. 3A), or a bottom gate/bottom contact structure in which the source electrode 25 and the drain electrode 26 are disposed on the backside of the organic semiconductor layer 21 (FIG. 3B).

Figure 4A:
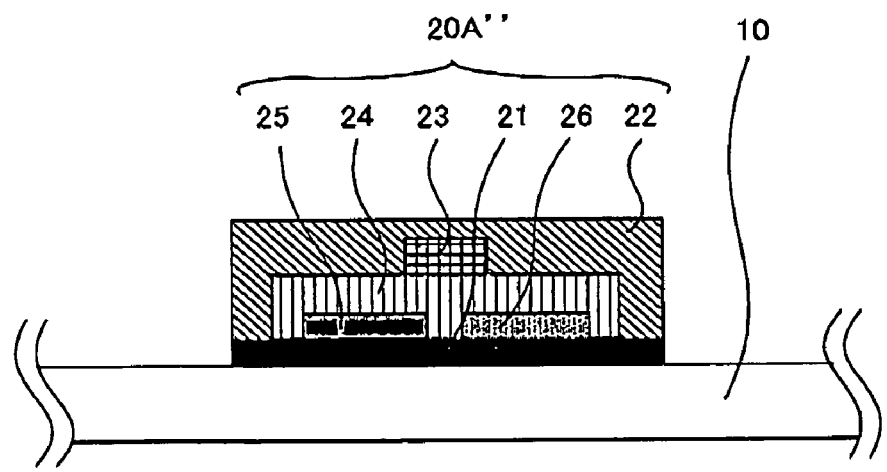
FIGS. 4A to 4B are each a schematic view showing another example of an organic semiconductor transistor included in an organic semiconductor device manufactured in a first embodiment according to the present invention.
Figure 4B:
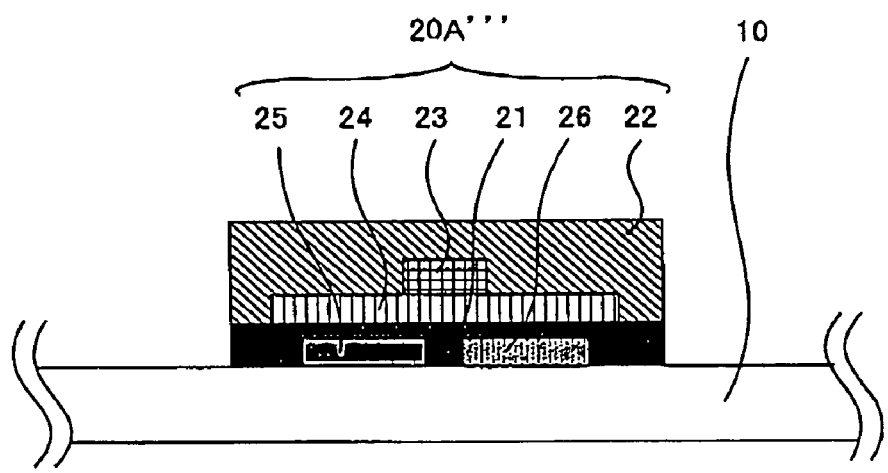

Then, an organic semiconductor transistor formed in this process when it has a top gate type structure will be described with reference to drawings. FIGS. 4A and 4B are each a schematic view showing an example of an embodiment of an organic semiconductor transistor produced in this process when it has a top gate type structure. As illustrated in FIGS. 4A and 4B, the organic semiconductor transistors 20A" and 20A'" formed in this process may each have a top gate type structure provided with a substrate 10, an organic semiconductor layer 21 formed on the substrate 10, a source electrode 25 and a source electrode 26 formed so as to be in contact with the organic semiconductor layer 21, a gate insulation layer 24 formed on the organic semiconductor layer 21, a gate electrode 23 formed on a gate insulation layer 24 and a passivation layer 22 formed so as to cover the gate electrode 23 and gate insulation layer 24.

Also, such a top gate type structure may be: a top gate/top contact type structure in which the source electrode 25 and the drain electrode 26 are disposed on the upper side of the organic semiconductor layer 21 (FIG. 4A), or a top gate/bottom contact type structure in which the source electrode 25 and the drain electrode 26 are disposed on the backside of the organic semiconductor layer 21 (FIG. 4B).

2. Other Steps

The manufacturing method of an organic semiconductor device in this embodiment may be provided with other steps besides the organic semiconductor transistor formation step. No particular limitation is imposed on these other steps and appropriate steps may be selected according to factors such as the use of the organic semiconductor device in this embodiment. Example of these other steps may include a pixel electrode formation step of forming a pixel electrode in such a manner that it is connected to the organic semiconductor transistor in a case where the organic semiconductor device according to the embodiment is used as a TFT array substrate for a liquid crystal display.

3. Organic Semiconductor Device

The organic semiconductor device produced in this embodiment has a structure, in which plural organic semiconductor transistors provided with an organic semiconductor layer made of an organic semiconductor material and a passivation layer formed on the organic semiconductor layer are formed on a substrate.

In such an organic semiconductor device, no particular limitation is imposed on the structure in which the organic semiconductor transistor is formed on the substrate and the organic semiconductor transistor may be disposed in a desired form according to factors such as the use of the organic semiconductor device of this embodiment.

As to the applications of the organic semiconductor device produced in this embodiment, it may be used as, for example, a TFT array substrate of a display device using a TFT system. Examples of such a display device may include a liquid crystal display device, electrophoresis display device and organic EL display device.

B. Manufacturing Method of an Organic Semiconductor Device According to a Second Embodiment A manufacturing method of an organic semiconductor device according to a second embodiment will be explained next. The manufacturing method of an organic semiconductor device of the second embodiment comprises an organic semiconductor transistor formation process, wherein the process includes: an organic semiconductor layer formation step of using a substrate to form an organic semiconductor layer made of an organic semiconductor material on the substrate; a gate insulation layer formation step of forming pattern-wise on the organic semiconductor layer a gate insulation layer having an ability of shielding vacuum ultraviolet light; and an organic semiconductor layer patterning step of irradiating vacuum ultraviolet light to the gate insulation layer and to the organic semiconductor layer to etch the organic semiconductor layer corresponding to a part where the gate insulation layer is not formed.

Figure 5A:
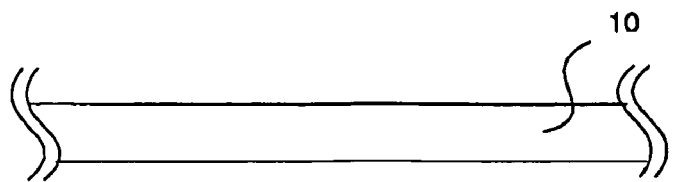
FIGS. 5A to 5E are a schematic view showing an example of a manufacturing method of an organic semiconductor device according to a second embodiment of the present invention.
Figure 5B:
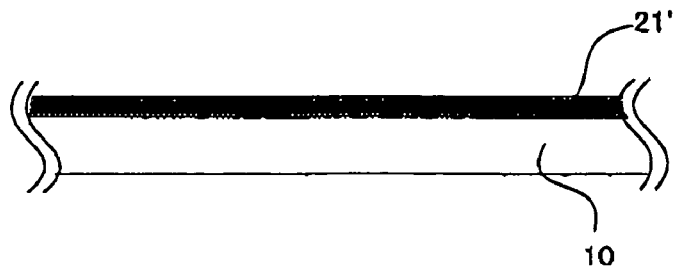
Figure 5C:
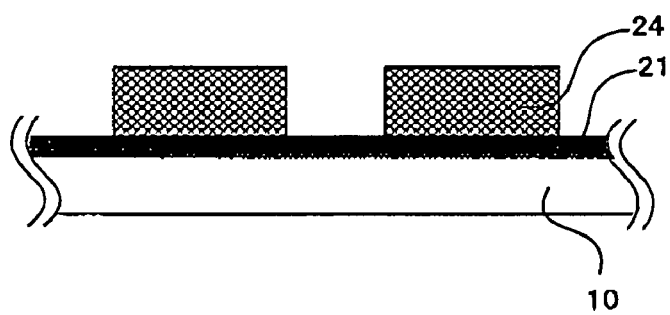
Figure 5D:
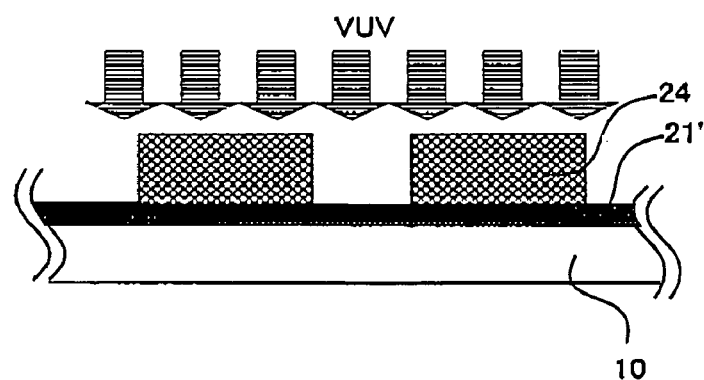
Figure 5E:
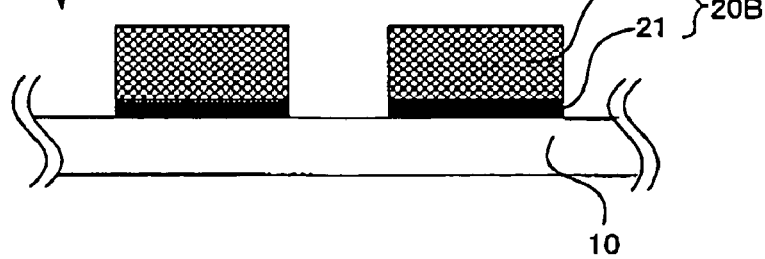

The manufacturing method of an organic semiconductor device in this embodiment will be described with reference to the drawings. FIGS. 5A to 5E are a schematic view showing an example of the manufacturing method of this embodiment. As is illustrated in FIGS. 5A to 5E, the manufacturing method of an organic semiconductor device of this embodiment is a method provided with an organic semiconductor transistor formation process involving: an organic semiconductor layer formation step of using a substrate 10 (FIG. 5A) to form an organic semiconductor layer 21' made of an organic semiconductor material on the substrate 10 (FIG. 5B); a gate insulation layer formation step of forming a gate insulation 24 having the ability of shielding vacuum ultraviolet light, pattern-wise on the organic semiconductor layer 21' (FIG. 5C); and an organic semiconductor layer patterning step of irradiating vacuum ultraviolet light to each surface of the gate insulation layer 24 and the organic semiconductor layer 21' to etch the organic semiconductor layer 21' corresponding to the part where the gate insulation layer 24 is not formed (FIG. 5D), to manufacture an organic semiconductor device 1 formed with an organic semiconductor transistor 20B having a structure, wherein the organic semiconductor layer 21 with the gate insulation layer 24 laminated thereon is formed on the substrate 10 (FIG. 5E).

According to this embodiment, since the gate insulation layer to be formed in the gate insulation layer formation step has the ability of shielding vacuum ultraviolet light, and since the organic semiconductor layer patterning step is a process of carrying out patterning of the organic semiconductor layer by irradiating vacuum ultraviolet light to the organic semiconductor layer and to the gate insulation layer, the result is brought in the organic semiconductor layer patterning step that the gate insulation layer functions as a mask shielding vacuum ultraviolet light, and therefore only the organic semiconductor layer corresponding to the part where the gate insulation layer is not formed can be removed, thereby making it possible to carry out patterning. Consequently, according to this embodiment, the patterning of the organic semiconductor layer can be simply attained with high accuracy only by merely irradiating vacuum ultraviolet light.

From this fact, according to this embodiment, the patterning of the organic semiconductor layer can be simply attained with high accuracy, and therefore an organic semiconductor device having an organic semiconductor transistor can be produced with high productivity.

When an organic semiconductor transistor using an organic semiconductor material is manufactured, a photographic method has been usually used as a method of patterning a layer made of an organic semiconductor material. However, this photolithographic method has the problem that its process is complicated and is therefore inferior in productivity.

According to this embodiment, on the other hand, the gate insulation layer formed in the gate insulation layer formation step is made to have the ability of shielding vacuum ultraviolet light, and it is therefore possible to pattern the organic semiconductor layer only by simply irradiating vacuum ultraviolet light from a light source without using a photomask and a photoresist. Therefore, according to this embodiment, an organic semiconductor device can be produced with high productivity.

The manufacturing method of an organic semiconductor device according to this embodiment comprises an organic semiconductor transistor formation process involving at least the organic semiconductor layer formation step, the gate insulation layer formation step and the organic semiconductor layer patterning step, and may involve other steps according to the need.

Each step used in the manufacturing method of an organic semiconductor device according to this embodiment will be described below.

1. Organic Semiconductor Transistor Formation Process

First, the organic semiconductor transistor formation process used in this embodiment will be described. This step includes: an organic semiconductor layer formation step of using a substrate to form an organic semiconductor layer made of an organic semiconductor material on the substrate, a gate insulation layer formation step of forming a gate insulation layer having the ability of shielding vacuum ultraviolet light pattern-wise on the organic semiconductor layer, and an organic semiconductor layer patterning step of irradiating vacuum ultraviolet light to the gate insulation layer and to the organic semiconductor layer to etch the organic semiconductor layer corresponding to the part where the gate insulation layer is not formed. The manufacturing method of an organic semiconductor device in this embodiment enables the formation of an organic semiconductor device with high productivity since it is provided with such an organic semiconductor transistor formation process.

The respective organic semiconductor layer formation step, gate insulation layer formation step, organic semiconductor layer patterning step and other steps to be used in this process will be described below.

(1) Gate Insulation Layer Formation Step

First, the gate insulation layer formation step used in this process will be described. This step is a process of forming a gate insulation layer having the ability of shielding vacuum ultraviolet light used in the organic semiconductor layer patterning step which will be described later, pattern-wise on the organic semiconductor layer formed in the organic semiconductor layer formation step which will be described later. Also, the gate insulation layer formed in this process has: a function as a mask used to etch the organic semiconductor layer pattern-wise when carrying out the patterning of the organic semiconductor layer by using vacuum ultraviolet light in the organic semiconductor layer patterning step, and the ability of insulating the gate electrode and source and drain electrodes in the organic semiconductor transistor manufactured in this process.

a. Method of Forming a Gate Insulation Layer

In this process, any method may be used without any particular limitation as method of forming the gate insulation layer insofar as the gate insulation layer has the ability desired to shield vacuum ultraviolet light used in the organic semiconductor layer patterning step which will be described later and is capable of forming a gate insulation layer having a desired insulation ability. Among these methods, a method in which a gate insulation layer formation coating solution prepared by dissolving an insulation resin material having the aforementioned light-shielding and insulating functions in a solvent is applied pattern-wise to the organic semiconductor layer is preferably used in this process. This is because the use of this method makes possible to form the gate insulation layer in a simple process.

Any insulation resin material may be used as the insulation resin material used in the gate insulation layer formation coating solution without any particular limitation insofar as it can form the gate insulation layer having the light-shielding and insulating functions. The insulation resin material to be used in this process is those having a voltage endurance of, preferably, 300 V/μm or less, more preferably 230 V/μm or less, and still more preferably 150 V/μm to 200 V/μm. This is because if such an insulation resin material is used, the gate insulation layer formed in this process can be more improved in its insulating function.

Figure 6A:
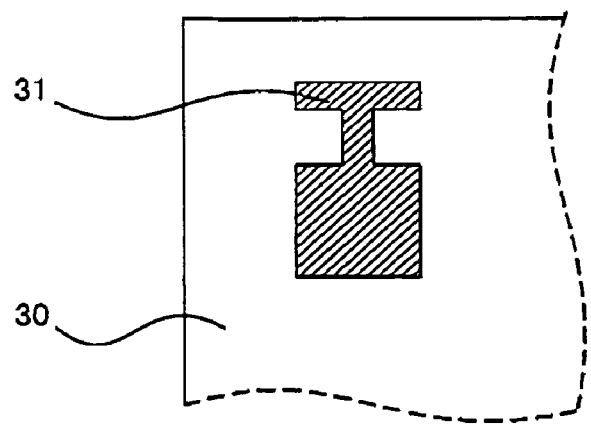
FIGS. 6A to 6C are a schematic view showing an example of a method of measuring the voltage endurance of an insulation resin material to be used in a second embodiment of the present invention.
Figure 6B:
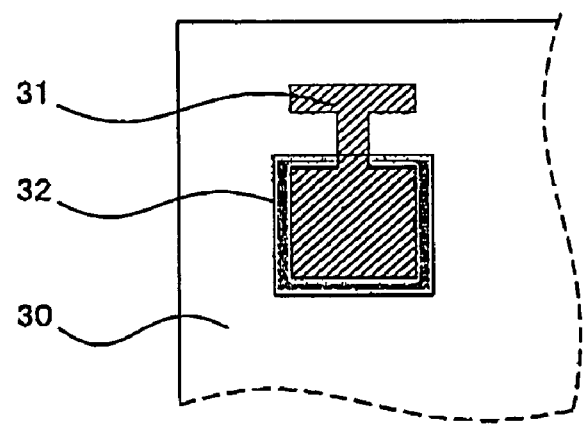
Figure 6C:
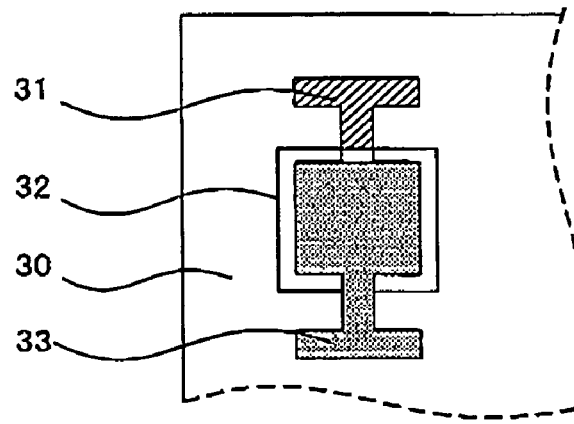
Figure 7A:
FIGS. 7A to 7F are a schematic view showing another example of a manufacturing method of an organic semiconductor device according to a second embodiment of the present invention.
Figure 7B:
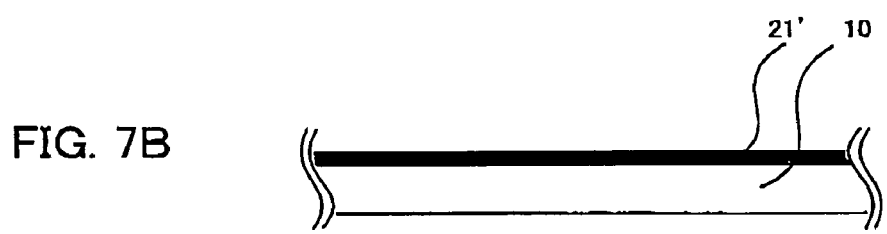
Figure 7C:
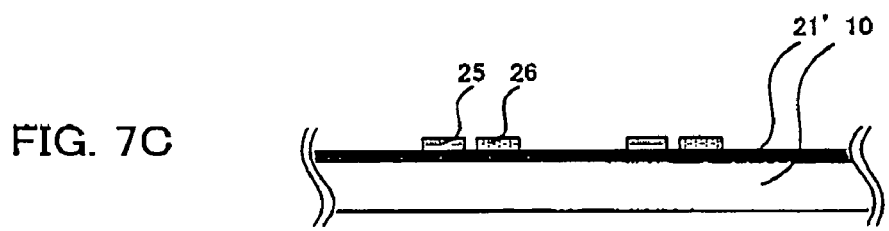
Figure 7D:
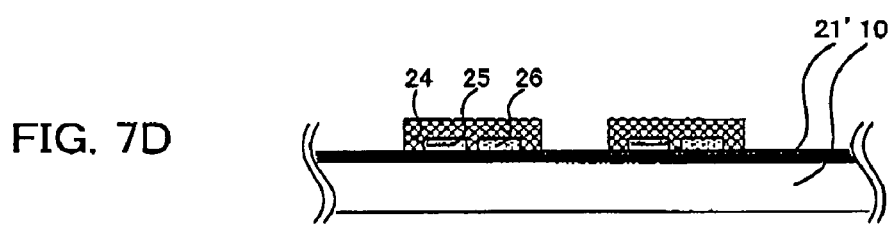
Figure 7E:
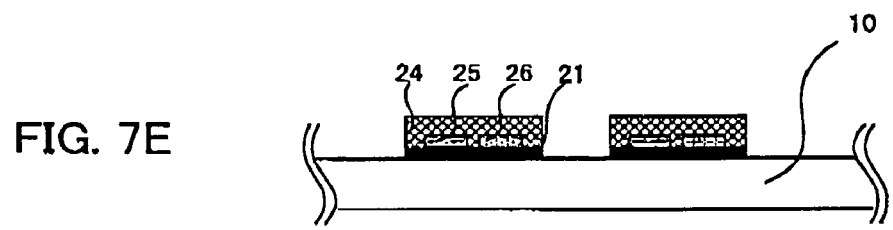
Figure 7F:
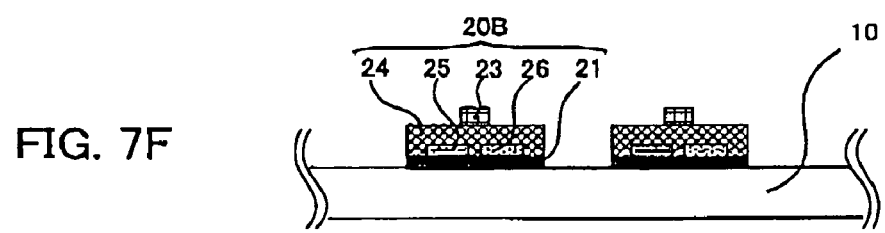

Here, the voltage endurance may be measured, for example, by a method as shown in FIGS. 6A to 6C.

1) A pattern of an ITO electrode 31 (1 mm×1 mm, thickness: 1200 Å, herein after, the ITO electrode 31 is called a lower electrode as the case may be) is formed on the surface of a glass substrate 30 of 100 mm×100 mm×0.7 mm (FIG. 6A).

2) Using a coating solution (solid content: 13% by weight) prepared by dissolving an insulation resin material, which is the subject of evaluation of voltage endurance, in a solvent, the coating solution is applied pattern-wise to the surface of the substrate 30 by a screen printing method to form an insulation layer 32. At this time, the pattern of a screen plate is designed to have dimensions of 1.2 mm×1.2 mm such that the insulation layer 32 covers the lower electrode 31, to align the both with each other prior to printing (FIG. 6B). Also, as the screen plate, one using a 500 mesh screen and an emulsion 3 μm in size is used and as the screen printer, a device manufactured by Micro-tech Co., Ltd. is used. Moreover, the printer is used in the following printing condition: printing pressure: 0.2 MPa, clearance: 2.1 mm and squeegee speed: 100 mm/sec.

3) The insulation layer 32 is dried at 100° C. by a hot plate for 30 minutes.

4) A metal mask having an opening of 1 mm×1 mm is disposed on the insulation layer 32 and an Au film having a film thickness of 50 nm is formed by vapor deposition to form an upper electrode 33 (FIG. 6C). At this time, the degree of vacuum and the rate of vapor deposition in the vapor deposition are designed to be $1\times10^4$ Pa and 1 Å/sec respectively.

5) A voltage of 0 to 300 V is applied across the upper electrode 31 and the lower electrode 33 to measure the value I of the current flowing across the upper electrode 31 and the lower electrode 33. Then, based on the obtained data, the resistance R (value obtained by dividing the applied voltage by the current value) of the insulation layer 32 is plotted as a factor of the field strength E (value obtained by dividing the applied voltage V by the film thickness "d" of the insulation layer 32) on a graph in which the abscissa is the field strength E and the ordinate is the resistance R. From the graph produced in this manner, the value $E_0$ of the field strength at which the resistance R suddenly drops is defined as dielectric breakdown voltage (voltage endurance).

Also, the insulation resin material used in this process is one having a dielectric constant (60 Hz to 1 MHz, room temperature) of preferably 3.0 or less, and more preferably 2.0 to 2.5.

Here, as the dielectric constant, a value obtained by measuring according to JIS K 6911 is adopted.

Moreover, the insulation resin material used in this process has a volume resistivity of preferably $1\times10^{15}$ Ω·cm or more, and more preferably $1\times10^{17}$ Ω·cm or more.

Here, as the volume resistivity, a value obtained by measuring according to JIS K 6911 is adopted.

Examples of such an insulation resin material may include PVP, PVA, PMMA, epoxy resins, acryl resins, polyimide, cardo-type resins, PS, fluorine type resins, ester type resins, polyamide type resins and phenol resins.

In this process, the insulation resin materials may be used either singly or in combinations of two or more.

In the meantime, any solvent may be used as the solvent used in the gate insulation layer formation coating solution without any particular limitation insofar as the insulation resin material can be dissolved in a desired concentration and the organic semiconductor material constituting the organic semiconductor layer is scarcely dissolved in this solvent. An appropriate solvent may be selected and used in accordance with, for example, the type of insulation resin material and the type of organic semiconductor material constituting the organic semiconductor layer. Examples of such a solvent include ethanol, propanol, butanol, pentanol, hexanol, isopropyl alcohol, PGMEA and water.

In this process, these solvents may be used either singly or in combinations of two or more.

Also, no particular limitation is imposed on the solid concentration of the gate insulation layer formation coating solution insofar as it is in a range where, for example, the solution viscosity and surface tension of the gate insulation layer formation coating solution fall in each desired range in accordance with the coating method used to apply the gate insulation layer formation coating solution to the surface of the organic semiconductor layer. The solid concentration is preferably in a range from 5% by weight to 30% by weight.

As the method for forming the gate insulation layer by applying the gate insulation layer formation coating solution to the organic semiconductor layer, any method that can form the gate insulation layer into a desired pattern may be used without any particular limitation. As such a method, the same methods that are described as the method of forming the passivation layer in the paragraph "A. Manufacturing method of an organic semiconductor device in the first embodiment" may be used and therefore, descriptions of this method are omitted here.

b. Gate Insulation Layer

The gate insulation layer formed in this process has the ability to shield vacuum ultraviolet light used in the organic semiconductor patterning step which will be described later. Here, there is no particular limitation to the level of the light-shielding ability as long as it is a level at which the organic semiconductor layer corresponding to the part where the gate insulation layer is formed in this process is not deteriorated. Therefore, the light-shielding level may be properly determined according to the wavelength of the vacuum ultraviolet light used in the organic semiconductor layer patterning step which will be described later. Particularly, the transmittance of the gate insulation layer for the vacuum ultraviolet light used in the organic semiconductor layer patterning step which will be described later is preferably 10% or less, more preferably 3% or less, and still more preferably 1% or less. This is because when the transmittance for the vacuum ultraviolet light is in the range, the organic semiconductor layer is prevented from deteriorating in the organic semiconductor layer patterning step which will be described later irrespective of the wavelength of the vacuum ultraviolet light used in the organic semiconductor layer patterning step which will be described later.

There is no particular limitation to the thickness of the gate insulation layer formed in this process insofar as it is in a range where the desired ability of shielding the vacuum ultraviolet light used in the organic semiconductor layer formation patterning step is obtained. Particularly, in this process, the thickness of the gate insulation layer is preferably 100 μm or less, more preferably in a range from 0.1 μm to 10 μm, and still more preferably in a range from 0.3 μm to 1 μm.

(2) Organic Semiconductor Layer Patterning Step

Next, the organic semiconductor layer patterning step used in this process will be described. In this process, the organic semiconductor layer formed by the organic semiconductor layer formation step which will be described later and the gate insulation layer formed by the gate insulation layer formation step are irradiated with vacuum ultraviolet light to etch the organic semiconductor layer corresponding to the part where the gate insulation layer is not formed.

In this process, the gate insulation layer functions as a mask for vacuum ultraviolet light used in this process and therefore, the patterning of the organic semiconductor layer can be easily attained only by irradiating vacuum ultraviolet light.

In this process, since the gate insulation layer is used as a mask to carry out patterning, the pattern of the organic semiconductor layer to be patterned in this process is the same as the pattern of the gate insulation layer which has been formed.

In this process, as mentioned above, the method is used to pattern the organic semiconductor layer in which the organic semiconductor layer corresponding to the part where the gate insulation layer is not formed is removed by irradiating the surface of the gate insulation layer and the surface of the organic semiconductor layer with the vacuum ultraviolet light. Here, the vacuum ultraviolet light and its light source in this embodiment are the same as those described for the vacuum ultraviolet light used in the organic semiconductor layer patterning step in the paragraph "A. Manufacturing method of an organic semiconductor device in the first embodiment" and therefore, descriptions of them are omitted here.

Also, no particular limitation is imposed on the dose of the vacuum ultraviolet light in this process as long as it is within a range where the organic semiconductor layer can be removed and the dose may be properly adjusted according to, for example, the type of organic semiconductor material constituting the organic semiconductor layer and the wavelength of the vacuum ultraviolet light.

There is no particular limitation to the method for irradiating vacuum ultraviolet light to the gate insulation layer and to the organic semiconductor layer in this process, insofar as it is capable of irradiating vacuum ultraviolet light to the gate insulation layer and to the organic semiconductor layer at a uniform dose. Here, the method for irradiating the vacuum ultraviolet light is the same as that described as the method for irradiating the vacuum ultraviolet light used in the organic semiconductor layer patterning step in the paragraph "A. Manufacturing method of an organic semiconductor device in the first embodiment" and therefore, descriptions of them are omitted here.

(3) Organic Semiconductor Layer Formation Step

Next, the organic semiconductor layer formation step used in this process will be described. This step is a process in which a substrate is used to form an organic semiconductor layer made of an organic semiconductor material on the substrate.

a. Method of Forming an Organic Semiconductor Layer

In this process, no particular limitation is imposed on the method of forming an organic semiconductor layer on the substrate insofar as it is a method capable of forming an organic semiconductor layer having a desired thickness on the substrate in accordance with factors such as the type of organic semiconductor material used in this process. Such a method is the same as that described in the paragraph "A. Manufacturing method of an organic semiconductor device in the first embodiment" and descriptions of this method are omitted here.

b. Substrate

As the substrate used in this process, a substrate having desired functions may be used in accordance with factors such as the use of the organic semiconductor device produced in this embodiment. Such a substrate is the same as that described in the paragraph "A. Manufacturing method of an organic semiconductor device in the first embodiment" and descriptions of this substrate are omitted here.

c. Organic Semiconductor Layer

No particular limitation is imposed on the thickness of the organic semiconductor layer formed in this process as long as it is in a range where an organic semiconductor layer having desired semiconductor characteristics can be formed in accordance with factors such as the type of the organic semiconductor material. The thickness of the organic semiconductor layer is preferably 1000 nm or less, more preferably in a range from 5 nm to 300 nm, and still more preferably in a range from 20 nm to 100 nm in this process.

(4) Other Steps

This process may involve other steps in addition to the gate insulation layer formation step, the organic semiconductor layer formation step and the organic semiconductor layer patterning step. As these other steps, any desired step may be used in accordance with factors such as the structure of the organic semiconductor transistor to be formed in this process without any particular limitation. Among these steps, a gate electrode formation step of forming a gate electrode on the gate insulation layer, and a source/drain electrode formation step of forming source and drain electrodes such that these electrodes are in contact with the organic semiconductor layer are usually used in this process.

Detailed descriptions are provided as to the case where this process involves the gate electrode formation step and the source/drain electrode formation step with reference to the drawings. FIGS. 7A to 7F are a schematic view showing an example of the case where this process involves the gate electrode formation step and the source/drain electrode formation step. As illustrated in FIGS. 7A to 7F, this process is used in an embodiment involving: an organic semiconductor layer formation step of using a substrate 10 (FIG. 7A) in general to form an organic semiconductor layer 21' on the substrate 10 by using the aforementioned method (FIG. 7B), a source/drain electrode formation step of forming a source electrode 25 and a drain electrode 26 on the organic semiconductor layer 21' (FIG. 7C), a gate insulation layer formation step of forming a pattern-like gate insulation layer 24 on the organic semiconductor layer 21' and the source and drain electrodes 25, 26 according to the aforementioned method (FIG. 7D), an organic semiconductor layer patterning step of patterning the organic semiconductor layer 21' into the same pattern as the gate insulation layer 24 by the aforementioned method (FIG. 7E), and a gate electrode formation step of forming a gate electrode 23 on the gate insulation layer 24 (FIG. 7F), to form an organic semiconductor transistor 20B.

Here, in FIGS. 7A to 7F, detailed descriptions are provided as to an example in which the source/drain electrode formation step is carried out after the organic semiconductor layer formation step. However, in this process, an embodiment may be adopted in which the source/drain electrode formation step is carried out before the organic semiconductor layer formation step.

In the case where, as illustrated in FIGS. 7A to 7F, the source/drain electrode formation step is carried out after the organic semiconductor formation step, and the organic semiconductor transistor manufactured in this process has a top gate/top contact structure. On the other hand, in the case where the source/drain electrode formation step is carried out before the organic semiconductor layer formation step, the organic semiconductor transistor manufactured in this process has a top gate/bottom contact structure.

The method of forming the gate electrode, the source electrode and the drain electrode respectively in the gate electrode formation step and the source/drain electrode formation step used in this process is the same as that usually used when a semiconductor transistor is formed and therefore, detailed descriptions are omitted here.

(5) Organic Semiconductor Transistor

The organic semiconductor transistor formed in this process is provided with at least the organic semiconductor layer and the gate insulation layer. Usually, besides the organic semiconductor layer and the gate insulation layer, a gate electrode, a source electrode and a drain electrode are used in the organic semiconductor transistor, whereby the function as a transistor is developed.

Also, the organic semiconductor transistor formed in the process has a top gate type structure since the gate insulation layer is formed on the organic semiconductor layer. Here, no particular limitation is imposed on the organic semiconductor transistor formed in this process insofar as it has a top gate type structure. Therefore, the organic semiconductor transistor may have a top gate/top contact structure or a top gate/bottom contact structure.

Figure 8A:
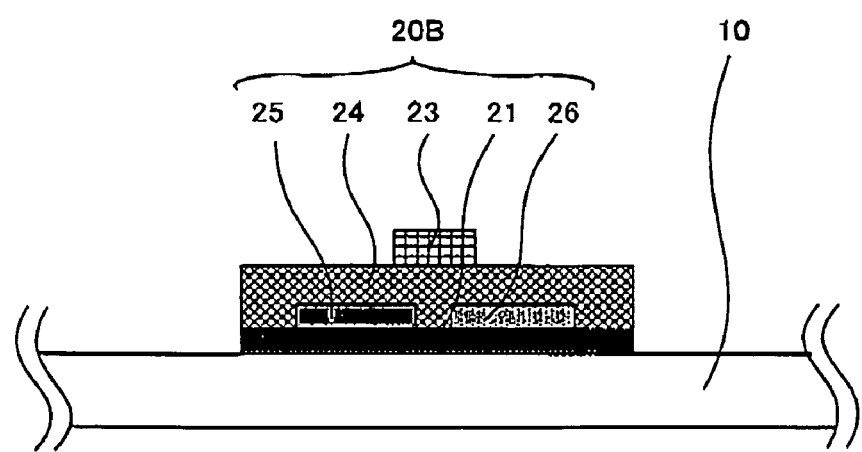
FIGS. 8A and 8B are each a schematic view showing an example of an organic semiconductor transistor included in an organic semiconductor device manufactured in a second embodiment according to the present invention.
Figure 8B:
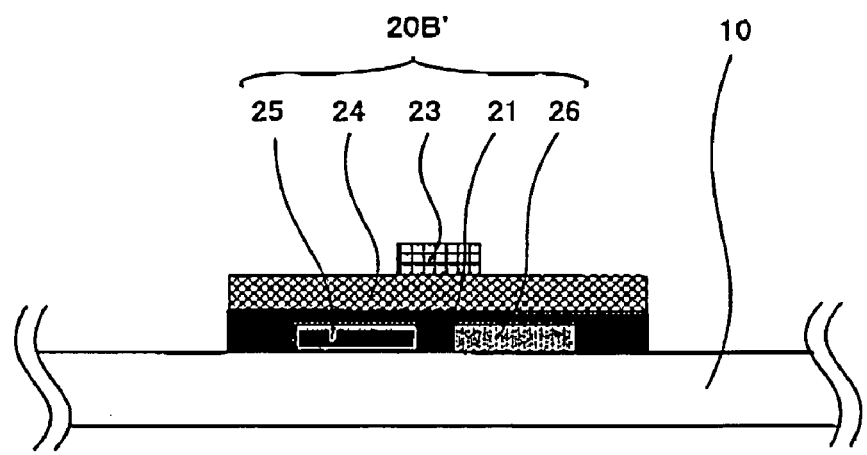

An organic semiconductor formed in this process will be described with reference to the drawings. FIGS. 8A and 8B are each a schematic view showing an example of an embodiment of an organic semiconductor transistor formed in this process. As illustrated in FIG. 8A, organic semiconductor transistors 20B and 20B' formed in this process may each have a top gate/top contact structure provided with a substrate 10, an organic semiconductor layer 21 formed on the substrate 10, a source electrode 25 and a drain electrode 26 which are formed so as to be in contact with the organic semiconductor layer 21, a gate insulation layer 24 formed on the organic semiconductor layer 21, and a gate electrode 23 formed on the gate insulation layer 24. Also, the organic semiconductor transistors may have, as shown in FIG. 8B, a top gate/bottom contact structure provided with a substrate 10, a source electrode 25 and a drain electrode 26 which are formed so as to be in contact with the substrate 10, an organic semiconductor layer 21 formed on the source and drain electrodes 25 and 26, a gate insulation layer 24 formed on the organic semiconductor layer 21, and a gate electrode 23 formed on the gate insulation layer 24.

The organic semiconductor transistor formed in this process may be provided with other structures besides the gate insulation layer, the organic semiconductor layer, the source electrode, the drain electrode and the gate electrode. As these other structures, those having desired functions according to factors such as the uses of the organic semiconductor device manufactured in this embodiment may be used. Examples preferably used in this embodiment as the other structure may include a passivation layer which will be formed on the gate insulation layer and on the gate electrode. As such a passivation layer, one made of a fluororesin, PVA, PVP or the like may be used.

2. Other Steps

The manufacturing method of an organic semiconductor device in this embodiment may be provided with other steps besides the organic semiconductor transistor formation process. These other steps are the same as those described in the paragraph "A. Manufacturing method of a semiconductor device in the first embodiment" and descriptions of these steps are omitted here.

3. Organic Semiconductor Device

The organic semiconductor device produced in this embodiment has a structure in which plural organic semiconductor transistors provided with an organic semiconductor layer made of an organic semiconductor material and with a gate insulation layer formed on the organic semiconductor layer are formed on a substrate. In such an organic semiconductor device, no particular limitation is imposed on the structure in which the organic semiconductor transistor is formed on the substrate and the organic semiconductor transistor may be disposed in a desired form according to factors such as the use of the organic semiconductor device.

The applications of the organic semiconductor device produced in this embodiment are the same as those described in the paragraph "A. Manufacturing method of an organic semiconductor device in the first embodiment" and descriptions of these applications are omitted here.

The present invention is not limited to the aforementioned embodiments. These embodiments are examples and whatever has substantially the same structure and produces the same action effect as the technical spirit described in the claim of the present invention is embraced by the technical scope of the present invention.

EXAMPLES

The present invention will be described in more detail by way of examples.

1. Example in Relation to the Manufacturing Method of an Organic Semiconductor Device in the First Embodiment (1) Example 1

Gate Electrode Formation Step

A screen mask provided with an opening having a gate electrode form was disposed on a 100 mm×100 mm×0.7 mm glass substrate with Cr (thickness of Cr: 300 nm) and then, an etching paste (manufactured by Kansai Paint Co., Ltd.) was formed on the substrate by screen printing. Then, the print substrate was placed on a hot plate kept at 100° C. for 5 minutes to cure the resist. Then, a Cr etching solution was used to etch Cr on a part other than the patterned part and then, the resist was peeled off by a 5% NaOH solution. After that, the substrate was washed with pure water in an ultrasonic cleaner.

(Gate Insulation Layer Formation Step)

Next, a photoresist (acryl type negative resist) was applied as a gate insulation layer to the substrate by spin coating. At this time, the spin coating was continued at 800 rpm for 10 seconds. Thereafter, the substrate was dried at 120° C. for 2 minutes and then, subjected to pattern exposure carried out at a dose of 350 mJ/cm$^2$.

Next, a developing step was carried out to remove a part other than the gate electrode and then, the substrate was dried in an oven kept at 200° C. for 30 minutes.

(Source/Drain Electrode Formation Step)

A metal mask provided with an opening having a source/drain electrode form was disposed on the surface of the substrate after the gate insulation layer was formed and then, an Au film 50 nm in thickness was deposited to form source and drain electrodes. In the deposition, the degree of vacuum was 1×10$^4$ Pa and the rate of deposition was about 1 Å/sec. The formed source and drain electrodes were observed by a reflection type optical microscope to find that the inter-electrode distance (channel length) between the source and drain electrodes was 50 μm.

(Organic Semiconductor Layer Formation Step)

Next, the substrate formed with the source and drain electrodes was coated with a polymer organic semiconductor by a spin coating method. As the polymer organic semiconductor, a solution having a solid content of 0.2 wt % and containing a solvent dichlorobenzene was used. After that, the substrate was heated gradually up to 200° C. at a rate of 20° C./min, retained at 200° C. for 10 minutes and then, cooled gradually down to room temperature at a rate of 6° C./min.

(Passivation Layer Formation Step)

Next, PVP was used as a light-shielding resin material and a crosslinking agent was mixed in the PVP. The mixture was dissolved in a hexanol solvent such that the solid content was 30% by weight to prepare a passivation layer formation coating solution. Then, a pattern-like passivation layer was formed by a screen printing method. At this time, as the screen plate, one using a 500 mesh screen and an emulsion 1 μm in size was used and as the screen printer, a device manufactured by Micro-tech Co., Ltd. was used. Moreover, the printer was used in the following printing conditions: printing pressure: 0.2 MPa, clearance: 2.6 mm and squeegee speed: 100 mm/sec. Then, the substrate was heated gradually up to 200° C. at a rate of 20° C./min., retained at 200° C. for 10 minutes, and cooled gradually down to room temperature at a rate of 6° C./min.

(Organic Semiconductor Layer Patterning Step)

Next, vacuum ultraviolet light (172 nm, illuminance: 11 mW/cm$^2$) was irradiated to the entire surface of the substrate. At this time, Gap was 0.7 mm and irradiation time was 60 seconds. It was confirmed that because the passivation layer absorbed vacuum ultraviolet light after the vacuum ultraviolet light was irradiated, the organic semiconductor layer on the part where the passivation layer was not formed was removed and the organic semiconductor layer was left only on the part where the passivation layer was patterned.

(Evaluation)

The transistor characteristics of the organic semiconductor transistor of the manufactured organic semiconductor device were measured and as a result, this transistor was found to work as a transistor. At this time, the on-current and off-current of the organic semiconductor transistor were 1×10$^{-5}$ A and 3.5×10$^{-11}$ A respectively. The on-off ratio was a six-digit number and the threshold voltage was 10 V. As to the measuring conditions, gate voltage was applied by changing it from 100 V to −80V in steps of −2 V. Then, the source-drain voltage was fixed to −80 V to measure the value of current flowing across the source-drain electrodes. In the evaluation of the transistor, the transistor was measured under shielded conditions in the atmosphere regarding all cases.

(2) Comparative Example 1

An organic semiconductor device provided with an organic semiconductor transistor was manufactured in the same method as in Example except that a fluororesin was used as the light-shielding resin material.

(Evaluation)

The transistor characteristics of the organic semiconductor transistor of the manufactured organic semiconductor device were measured and as a result, this transistor was not found to work as a transistor. As to the measuring conditions, gate voltage was applied by changing it from 100 V to −80V in steps of −2 V. Then, the source-drain voltage was fixed to −80 V to measure the value of current flowing across the source-drain electrodes. In the evaluation of the transistor, the transistor was measured under shielded conditions in the atmosphere regarding all cases.

The reason why the organic semiconductor transistor did not work as a transistor was considered to be that because a fluororesin was used as the passivation layer, the passivation layer transmitted the vacuum ultraviolet light and therefore, the organic semiconductor layer under the passivation layer was removed.

2. Example in Relation to the Manufacturing Method of an Organic Semiconductor Device in a Second Embodiment (1) Example 2

Source/Drain Electrode Formation Step

A metal mask provided with an opening having a source/drain electrode form was disposed on a 100 mm×100 mm×0.7 mm glass substrate and then, an Au film 50 nm in thickness was vapor-deposited to form source and drain electrodes. In the deposition, the degree of vacuum was $1 \times 10^4$ Pa and the rate of deposition was about 1 Å/sec. The formed source and drain electrodes were observed by a reflection type optical microscope to find that the inter-electrode distance (channel length) between the source and drain electrodes was 50 μm.

(Organic Semiconductor Layer Formation Step)

Next, the substrate formed with the source and drain electrodes was coated with a polymer organic semiconductor by a spin coating method. As the polymer organic semiconductor, a solution having a solid content of 0.2 wt % and containing a solvent dichlorobenzene was used. After that, the substrate was heated gradually up to 200° C. at a rate of 20° C./min, retained at 200° C. for 10 minutes and then, cooled gradually down to room temperature at a rate of 6° C./min.

(Gate Insulation Layer Formation Step)

Next, PVP was used as an insulation resin material and a crosslinking agent was mixed in the PVP. The mixture was dissolved in a hexanol solvent such that the solid content was 30% by weight to prepare a gate insulation layer formation coating solution. Then, a pattern-like gate insulation layer was formed by a screen printing method. At this time, as the screen plate, one using a 500 mesh screen and an emulsion 1 μm in size was used and as the screen printer, a device manufactured by Micro-tech Co., Ltd. was used. Moreover, the printer was used in the following printing conditions: printing pressure: 0.2 MPa, clearance: 2.6 mm and squeegee speed: 100 mm/sec. Then, the substrate was heated gradually up to 200° C. at a rate of 20° C./min., retained at 200° C. for 10 minutes, and cooled gradually down to room temperature at a rate of 6° C./min.

(Organic Semiconductor Layer Patterning Step)

Next, vacuum ultraviolet light (172 nm, illuminance: 11 mW/cm$^2$) was irradiated to the entire surface of the substrate. At this time, Gap was 0.7 mm and irradiation time was 60 seconds. It was confirmed that because the gate insulation layer absorbed vacuum ultraviolet light after the vacuum ultraviolet light was irradiated, the organic semiconductor layer on the part where the gate insulation layer was not patterned was removed and the organic semiconductor layer was left only on the part where the gate insulation layer was patterned.

(Gate Electrode Formation Step)

A pattern of Ag nano-paste ink (manufactured by FUJIKURA KASEI CO., LTD.) was screen-printed on the substrate by using a screen plate having an opening having a gate electrode form. The substrate was heated gradually up to 200° C. at a rate of 20° C./min., retained at 200° C. for 20 minutes and cooled gradually to room temperature at a rate of 6° C./min.

(Evaluation)

The transistor characteristics of the organic semiconductor transistor of the manufactured organic semiconductor device were measured and as a result, this transistor was found to work as a transistor. At this time, the on-current and off-current of the organic semiconductor transistor were $2.1 \times 10^{-6}$ A and $3.7 \times 10^{-11}$ A respectively. The on-off ratio was a five-digit number and the threshold voltage was 30 V. As to the measuring conditions, gate voltage was applied by changing it from 100 V to −80V in steps of −2 V. Then, the source-drain voltage was fixed to −80 V to measure the value of current flowing across the source-drain electrodes. In the evaluation of the transistor, the transistor was measured under shielded conditions in the atmosphere regarding all cases.

(2) Comparative Example 2

An organic semiconductor device provided with an organic semiconductor transistor was manufactured in the same method as in Example except that a fluororesin was used as the insulation resin material.

(Evaluation)

The transistor characteristics of the organic semiconductor transistor of the manufactured organic semiconductor device were measured and as a result, this transistor was not found to work as a transistor. As to the measuring conditions, gate voltage was applied by changing it from 100 V to −80V in steps of −2 V. Then, the source-drain voltage was fixed to −80 V to measure the value of current flowing across the source-drain electrodes. In the evaluation of the transistor, the transistor was measured under shielded conditions in the atmosphere regarding all cases.

The reason why the organic semiconductor transistor did not work as a transistor was considered to be that because a fluororesin was used as the gate insulation layer, the gate insulation layer transmitted the vacuum ultraviolet light and therefore, the organic semiconductor layer under the gate insulation layer was removed.

What is claimed is:

1. A manufacturing method of an organic semiconductor device comprising an organic semiconductor transistor formation process, wherein the process includes:
   a gate electrode formation step of using a substrate to form a gate electrode on the substrate;
   a gate insulation layer formation step of forming a gate insulation layer so as to cover the gate electrode;
   an organic semiconductor layer formation step of forming an organic semiconductor layer made of an organic semiconductor material on the gate insulation layer and the substrate;
   a source/drain electrode formation step of forming a source electrode and a drain electrode so as to face each other on the organic semiconductor layer;
   a passivation layer formation step of forming on the organic semiconductor layer, the source electrode and the drain electrode a passivation layer having an ability of shielding vacuum ultraviolet light; and
   an organic semiconductor layer patterning step of irradiating vacuum ultraviolet light to the passivation layer and to the organic semiconductor layer to etch the organic semiconductor layer corresponding to a part where the passivation layer is not formed,
   wherein the passivation layer formed on the organic semiconductor layer, the source electrode and the drain electrode is left unetched after the organic semiconductor layer patterning step, a wavelength of the vacuum ultraviolet light is in the range from 10 nm to 200 nm, the passivation layer is made of a light-shielding resin material having the ability of shielding the vacuum ultraviolet light, and PVP, PVA, PMMA, PS, polyethylene oxide (PEO), an aqueous epoxy resin, an epoxy resin, an acryl resin, polyimide or a cardo-type resin is used as the light-shielding resin material.

* * * * *